(12) United States Patent
Nishida et al.

(10) Patent No.: US 7,260,132 B2
(45) Date of Patent: Aug. 21, 2007

(54) SEMICONDUCTOR LASER APPARATUS

(75) Inventors: Takehiro Nishida, Tokyo (JP); Tsutomu Yamaguchi, Tokyo (JP); Motoharu Miyashita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/397,727

(22) Filed: Apr. 5, 2006

(65) Prior Publication Data

US 2006/0227831 A1    Oct. 12, 2006

(30) Foreign Application Priority Data

Apr. 8, 2005  (JP)  ............................. 2005-112543
Jan. 25, 2006  (JP)  ............................. 2006-015982

(51) Int. Cl.
*H01S 5/00* (2006.01)

(52) U.S. Cl. ............... 372/50.12; 372/43.01; 372/50.121; 372/50.122; 372/68

(58) Field of Classification Search ............ 372/50.12, 372/50.121, 68, 43.01
See application file for complete search history.

(56) References Cited

U.S. PATENT DOCUMENTS

| | | | |
|---|---|---|---|
| 6,358,764 B1 * | 3/2002 | Nemoto | 438/22 |
| 6,546,035 B2 * | 4/2003 | Imafuji et al. | 372/50.12 |
| 6,680,958 B1 * | 1/2004 | Nemoto | 372/43.01 |
| 6,757,311 B2 * | 6/2004 | Abe | 372/43.01 |
| 6,778,578 B2 * | 8/2004 | Lee et al. | 372/68 |
| 6,914,869 B1 * | 7/2005 | Miura | 369/112.01 |
| 6,967,919 B2 * | 11/2005 | Arikawa et al. | 369/121 |
| 6,995,399 B2 * | 2/2006 | Abe et al. | 257/79 |
| 2004/0196877 A1 | 10/2004 | Kawakami et al. | |
| 2005/0069005 A1 * | 3/2005 | Nishida et al. | 372/50 |
| 2005/0286591 A1 * | 12/2005 | Lee | 372/50.12 |
| 2006/0050755 A1 * | 3/2006 | Suzuki et al. | 372/50.121 |
| 2006/0088950 A1 * | 4/2006 | Kim et al. | 438/46 |
| 2006/0093000 A1 * | 5/2006 | Nam et al. | 372/43.01 |

FOREIGN PATENT DOCUMENTS

| | | |
|---|---|---|
| JP | 2001-135891 | 5/2001 |
| JP | 2002-025104 | 1/2002 |
| JP | 2002-190649 | 7/2002 |
| JP | 2005-039105 | 2/2005 |

* cited by examiner

*Primary Examiner*—Minsun Oh Harvey
*Assistant Examiner*—Yuanda Zhang
(74) *Attorney, Agent, or Firm*—Leydig, Voit & Mayer, Ltd.

(57) ABSTRACT

A semiconductor laser apparatus includes multiple light emitting points, and a simple ridge stripe structure for each of the light emitting points. At least one of the light emitting points is disposed at a location that is 0% to 15% of the width of a substrate of the apparatus from the center, in the width direction, of the substrate.

14 Claims, 4 Drawing Sheets

SEMICONDUCTOR LASER APPARATUS

BACKGROUND OF THE INVENTION

1. Field of the Invention

The present invention relates to a semiconductor laser apparatus, and more specifically to a semiconductor laser apparatus having a plurality of light emitting points.

2. Background Art

Presently, as an optical recording medium, a compact disk (CD), a mini disk (MD), a digital versatile disk (DVD) or the like have been known. In the pickups of these recording media, for example, for replaying a DVD and a CD, laser of an oscillating wavelength of 650 nm for the DVD and laser of a oscillating wavelength of 780 nm for the CD are required for a light source. Furthermore, in order to realize the simplification or miniaturization of an optical pickup, a monolithic laser apparatus that can output both wavelengths of 650 nm and 780 nm from a chip is effective.

In the case of laser having a plurality of light emitting points, a structure wherein a plurality of light emitting points are disposed at even intervals or in left-right symmetry to the center of the chip is generally used. For example, in the case of a semiconductor laser having two light emitting points for CD/DVD and a chip width of 300 μm, in general, the two light emitting points are disposed in left-right symmetry, and the light emitting point of 650 nm—LD is generally controlled so as to locate at 55 μm from the center (18.3%). When the chip width is changed to 250 μm and 200 μm, the light emitting point of 650 nm—LD is also generally controlled so as to locate at 55 μm from the center (22% and 27.5%).

In a laser having the locations of light emitting points of such percentages to the width of the chip, since stress to light emitting points is different depending on left and right of each light emitting point, the elements fabricated from the same material using the same procedures have different characteristics depending on the locations of the light emitting points. When the locations of two light emitting points are asymmetry to the center of a chip, stress to the light emitting points differs depending on the distance from the center of the light emitting points to the width of the entire chip, and affects the light emitting characteristics.

Stress applied to a light emitting point becomes larger as the light emitting point departs from the center of a chip. Therefore, at the light emitting point apart from the center of a chip, the asymmetry of stress applied to the left and the right of the light emitting point cannot be negligible. For example, at the light emitting point greatly apart from the center of a chip to the right, strong stress is applied to the right of the light emitting point, and at the light emitting point greatly apart from the center of a chip to the left, strong stress is applied to the left of the light emitting point; therefore, the characteristics of the left light emitting point becomes different from those of the right light emitting point. In particular, when an off substrate (tilted substrate) is used, or when a plane close to a light emitting point is used as a die-bonding plane, since a solder material is used to bond the chip to a mounting point, such as a stem, the applied stress becomes larger, and asymmetry of the stress applied to the light emitting point becomes significant.

Particularly in the case of a simple ridge stripe structure wherein the both ends of the ridge stripe structure are not buried with a semiconductor material, since such stress is strong, the effect of the asymmetry is great.

As described above, stress applied to a light emitting point changes depending on the distance from the center of the chip to the light emitting point. For example, it has been clarified from experimental facts that when the surface close to the light emitting point of a double wavelength laser having a chip width of 200 μm, and a light emitting point of 650 nm—LD at the location of 55 μM from the center of the chip is die-bonded on the die bonding plane using a solder or the like, in optical properties, the polarization angle is less than −10°, and the polarization ratio decreases to about 60.

There is limitation in the distance between two light emitting points depending on the wavelength band to be used. For example, in a generally used 780 nm/650 nm double wavelength semiconductor laser apparatus for CD/DVD, a distance of about 110±10 μm is required between the two light emitting points. Therefore, all the light emitting points cannot be disposed in the vicinity of the center of the chip to minimize the effect of stress applied to the light emitting points.

SUMMARY OF THE INVENTION

In order to solve the above-described problems, it is an object of the present invention to provide a semiconductor laser apparatus having two or more light emitting points, which can obtain optimal optical properties for each element not by dispersing stress applied to each light emitting point in a form close to left-right symmetry (even disposure), but by making the way of applying stress uneven using back calculation according to the use of element in each location.

A semiconductor laser apparatus according to the present invention is a semiconductor laser apparatus having two or more light emitting points, wherein each of the light emitting points has a simple ridge stripe structure, and at least a light emitting point of the above-described two or more light emitting points is disposed on the location of 0 to 15% of the width of the substrate from the center in the width direction of the substrate. Other features of the present invention will be described below.

According to the present invention, by providing the above-described structure, a semiconductor laser apparatus having required optical properties at each light emitting point can be obtained while satisfying limitations on the distance between a plurality of light emitting points.

DETAILED DESCRIPTION OF THE PREFERRED EMBODIMENTS

Figure 1:
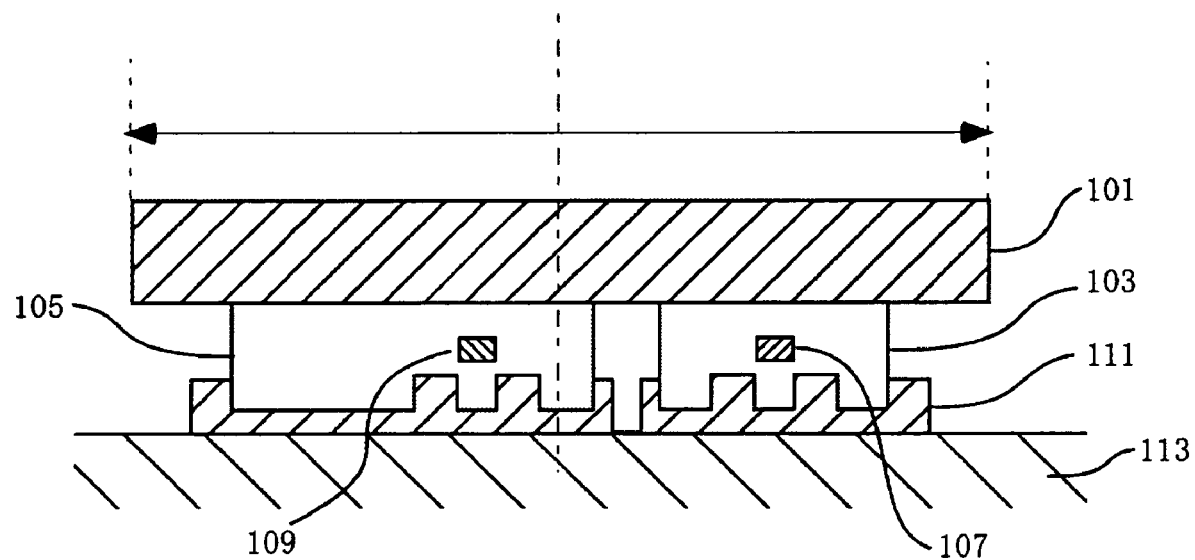
FIG. 1 shows a sectional view of a monolithic semiconductor laser apparatus according to an embodiment of the present invention.

FIG. 1 shows a sectional view of a monolithic semiconductor laser apparatus according to an embodiment of the present invention. The monolithic semiconductor laser apparatus has light emitting points 107 and 109 in semiconductor laser structures 103 and 105.

Since the way of application of stress in the light emitting points 107 and 109 is left-right asymmetric, the optical properties are affected. When a plane close to the light emitting points is used as a die-bonding plane as FIG. 1 shows, since the chip is bonded to a mounting point 113, such as a stem, using a solder material 111, asymmetry of the stress applied to the light emitting point becomes significant. Since the location of the light emitting point 109 of the semiconductor laser of the present invention is closer to the center of the chip compared to a conventional semiconductor laser, the asymmetry of the stress applied to the light emitting point is reduced than the light emitting point of the conventional semiconductor laser. On the contrary, the location of the emitting point 107 becomes far from the center of the chip, and more stress is applied. Therefore, the optical properties of each light emitting point are different from the optical properties of light emitting points of the conventional semiconductor laser. The properties can be optimized by optimizing the ratio from the center to the light emitting point or the like.

FIGS. 2A, 2B, 2C, 3A and 3B show the schematic sectional views of the manufacturing steps for a monolithic semiconductor laser according to an embodiment of the present invention. The monolithic semiconductor laser according to the embodiment includes two different semiconductor lasers; a laser for DVD of a light emitting wavelength in 655±20 nm band and a laser for CD of a light emitting wavelength in 785±20 nm band. A chip width W1 is 250 µm. Since there is limitation in the distance between light emitting points, the width of the chip must be 100 µm or more in order to address a laser having various light emitting wavelength; however, if the width is excessively large, the manufacturing costs increase. Therefore, the width is preferably 300 µm or less.

Figure 2A:
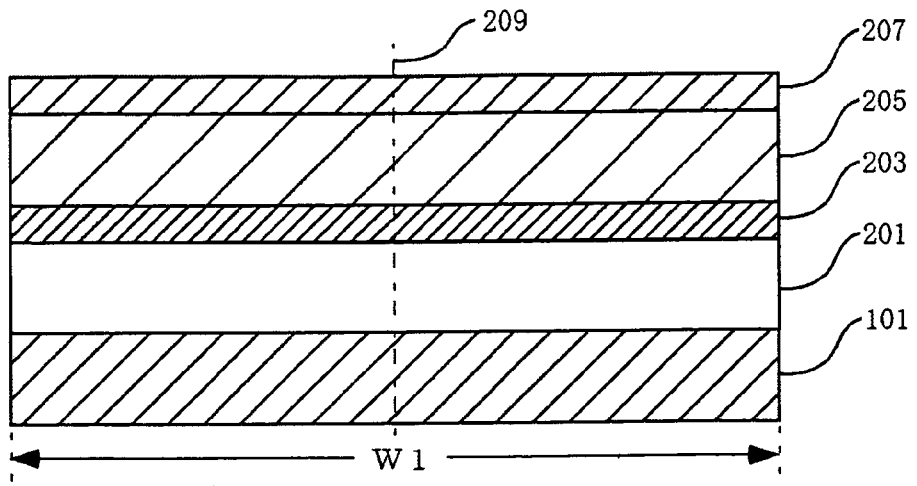
FIGS. 2A, 2B, 2C, 3A and 3B show the schematic sectional views of the manufacturing steps for a monolithic semiconductor laser according to an embodiment of the present invention.

First, referring to FIG. 2A, a laminated structure is fabricated on an n-GaAs substrate 101. As a first semiconductor laser, an n-AlGaInP lower clad layer 201, an AlGaAs active layer 203, a p-AlGaInP upper clad layer 205, and a p-GaAs cap layer 207 are laminated on the n-GaAs substrate 101. Each semiconductor layer is formed using, for example, an MOCVD method.

Figure 2B:
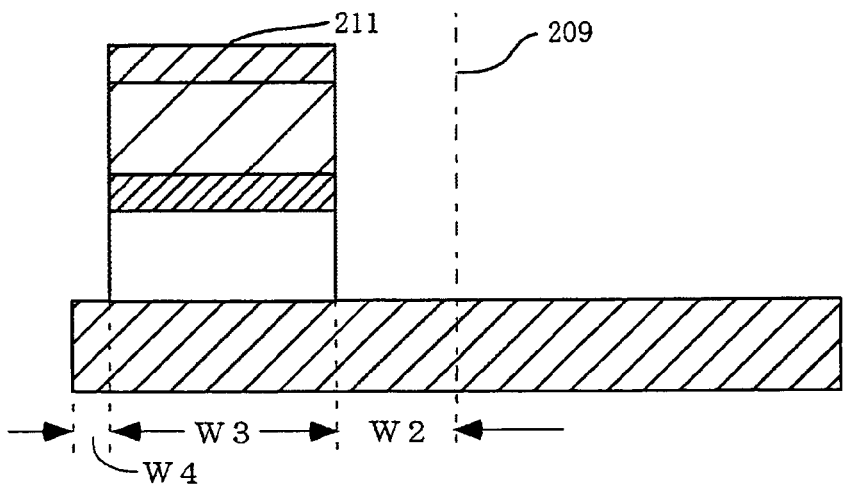

Next, referring to FIG. 2B, the laminated structure in the regions other than a width W3=70 µm from the location of W2=40 µm from the center 209 of the chip are removed using photographic and etching techniques to form a first semiconductor laser 211. In FIG. 2B, W4 is 15 µm.

Figure 2C:
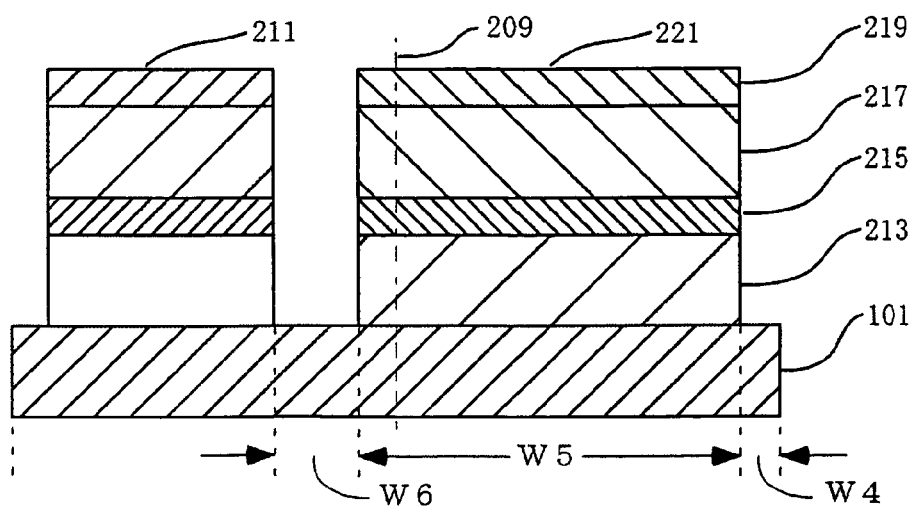

Then, referring to FIG. 2C, as a second semiconductor laser 221, an n-AlGaInP lower clad layer 213, an AlGaInP active layer 215, a p-AlGaInP upper clad layer 217, and a p-GaAs cap layer 219 are laminated on the regions from which the above-described laminated structure shown in FIG. 2B is removed. Each semiconductor layer is formed using, for example, an MOCVD method. The second semiconductor laser 221 is formed in a width of W5=120 µm from the location of 10 µm from the center 209 of the chip in the same direction as the first semiconductor laser 211. The distance W6 between the first semiconductor laser 211 and the second semiconductor laser 221 is 30 µm.

Figure 3A:
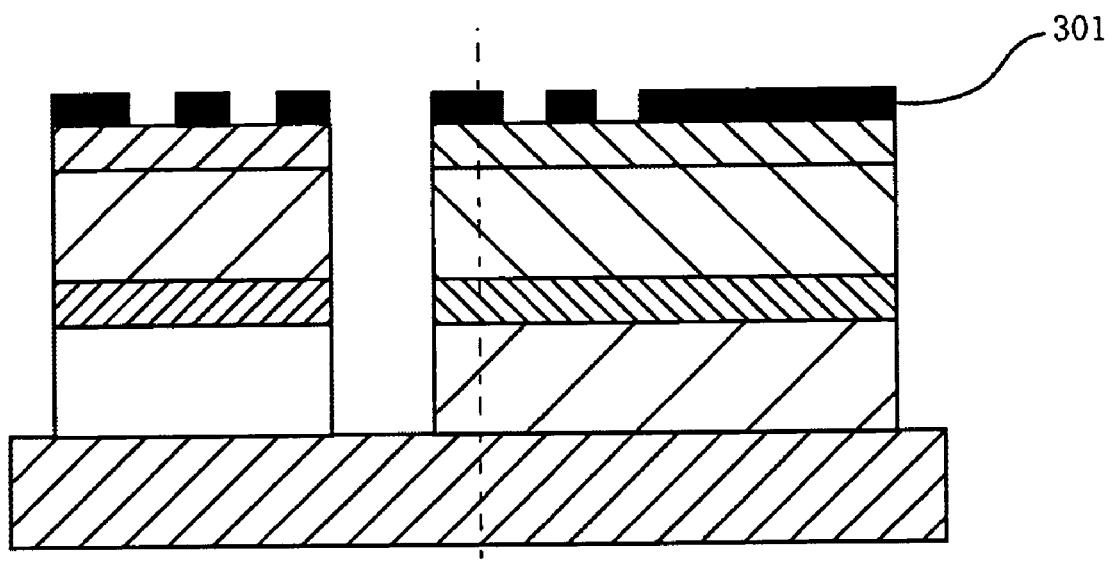

Then, as FIG. 3A shows, using a resist mask 301 as an etching mask, the p-GaAs cap layer 219 and to the middle of the p-AlGaInP upper clad layer 217 are removed using, for example, a sulfuric acid-based etchant or the like. At this time, if a layer, such as an InGaP layer having selectivity to etching used as an etching stopper layer is inserted between the p-GaAs cap layer 219 and the p-AlGaInP upper clad layer 217, etching can be controlled more accurately.

Figure 3B:
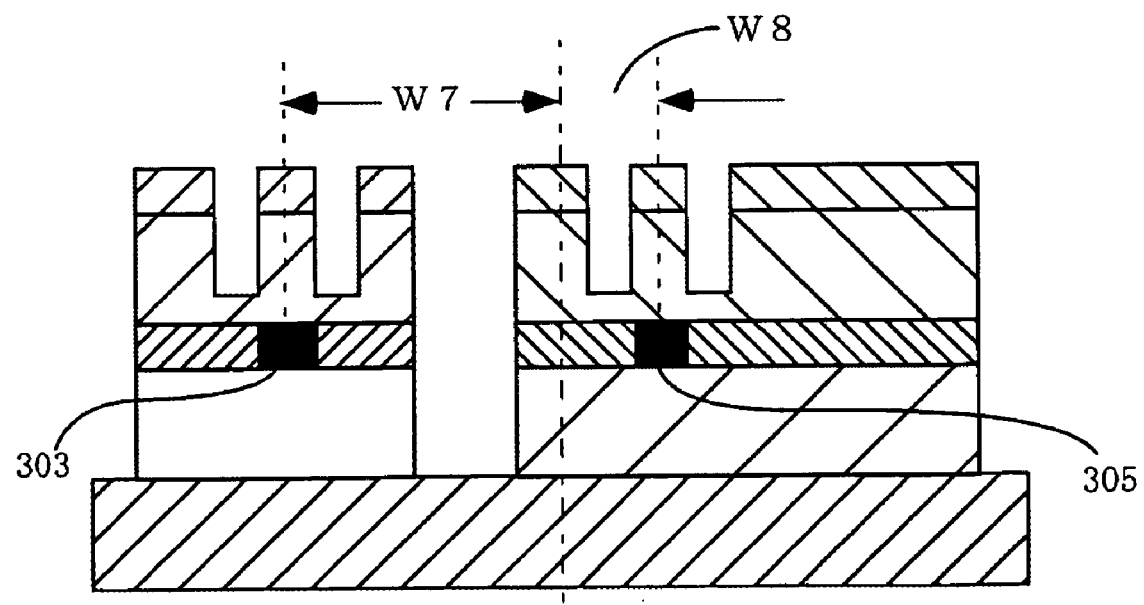

Through the above-described steps, a ridge stripe structure as shown in FIG. 3B can be obtained. Here, a simple ridge stripe structure is formed for each light emitting point so that the both ends of the ridge stripe structure are not buried with a semiconductor material. Next, by forming metal electrodes (not shown) on top and bottom surfaces, a monolithic semiconductor laser is completed.

Such a monolithic semiconductor laser is formed at the location having the ridge stripe distance between the two semiconductor lasers 211 and 221, specifically the location where light emitting points 303 and 305 are asymmetric to the center of the chip and specifically the light emitting point 303 and the light emitting point 305 are formed at the locations W7=80 µm and W8=30 µm, respectively (the location of a chip ratio of 12%). The light emitting wavelengths are 780 nm and 650 nm, respectively.

In both LDs of 780 nm and 650 nm, if a layer to be an etching stopper layer is disposed on the active layer, optical properties such as a far field pattern (FFP) can be effectively and easily controlled.

In the 780 nm-LD, AlGaAs is generally used for upper and lower clad layers. Although a first semiconductor laser and a second semiconductor laser are fabricated by forming laminated structures in different steps in the above-described embodiment, if substantially same clad layers (e.g., AlGaInP) are used in the 780 nm-LD and the 650 nm-LD, etching can be simultaneously controlled. In such a case, there is advantage of simultaneous fabrication of light emitting points. When dry etching, not wet etching, is used, difference in etching rates can be reduced, and is further effective. The equivalent effect can be obtained using a material composed of $Al_xGa_yIn_{1-x-y}As_zP_{1-z}$ ($0 \leq x \leq 1$, $0 \leq y \leq 1$, $0 \leq z \leq 1$) or $Al_xGa_yIn_{1-x-y}N_zAs_{1-z}$ ($0 \leq x \leq 1$, $0 \leq y \leq 1$, $0 \leq z \leq 1$) as materials for the clad layer or other layers constituting the laser apparatus.

By using a photolithography technique, two semiconductor lasers can be simultaneously patterned. A photoresist film can be substituted by other pattern films having etching resistance.

The equivalent effect can be obtained from a 980 nm-LD (for example, the active layer thereof is composed of InGaAsP) or a 410 nm-LD (for example, the active layer thereof is composed of InAlGaN). A material composed of $Al_xGa_yIn_{1-x-y}As_zP_{1-z}$ ($0 \leq x \leq 1$, $0 \leq y \leq 1$, $0 \leq z \leq 1$) or $Al_xGa_yIn_{1-x-y}N_zAs_{1-z}$ ($0 \leq x \leq 1$, $0 \leq y \leq 1$, $0 \leq z \leq 1$) can also be used as other materials for constituting an active layer similarly to materials for the clad layer or other layers constituting the laser apparatus.

Figure 4A:
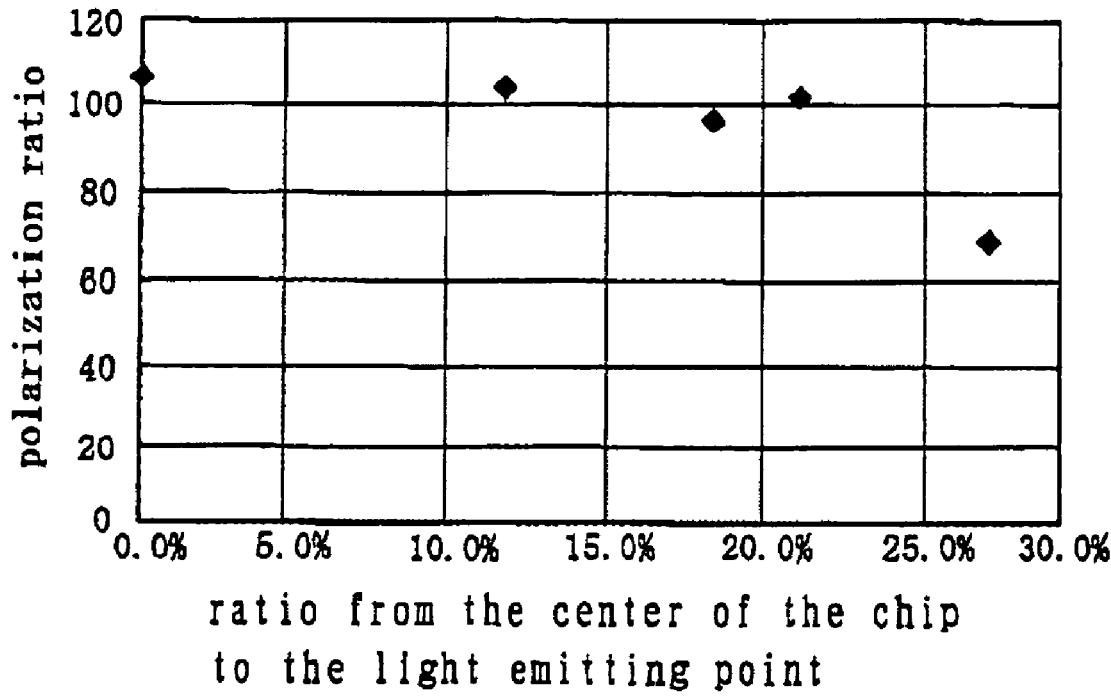
FIGS. 4A and 4B show an optical property in a double wavelength LD-laser as in the embodiment of the present invention.
Figure 4B:
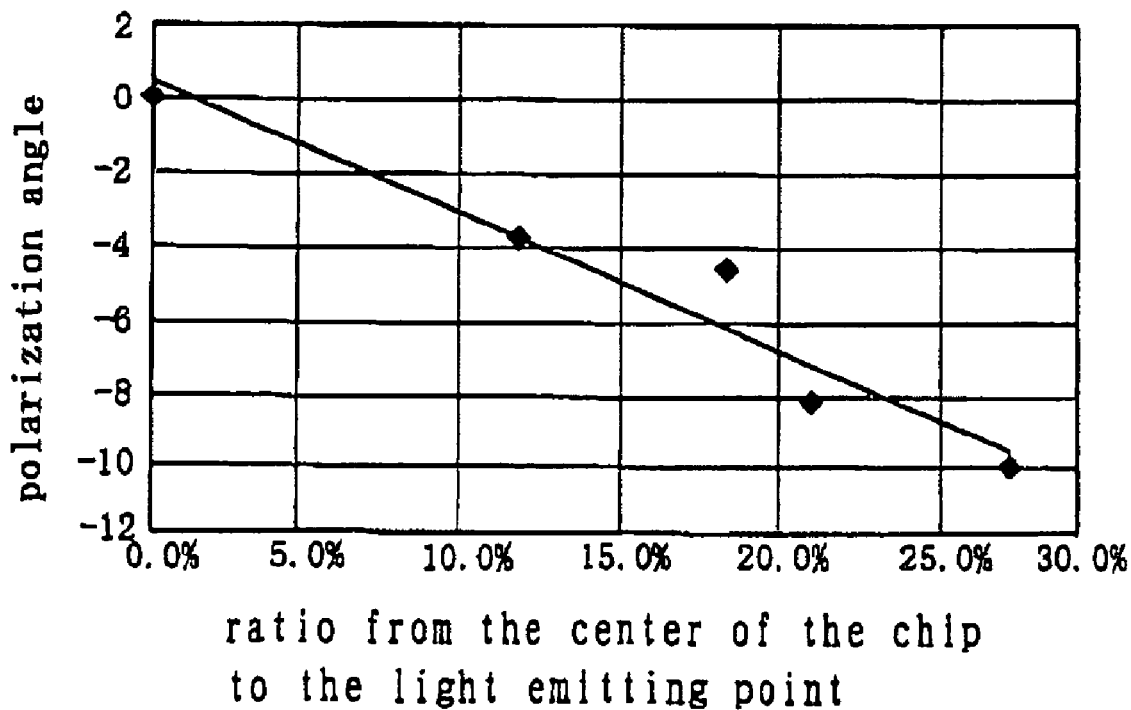

The chip wherein the locations of light emitting points are controlled improves the optical properties of the LD especially having light emitting points at locations close to the center. FIGS. 4A and 4B show an optical property in a double wavelength LD-laser as in the embodiment of the present invention, when the ratio from the center of the chip of a 650 nm-LD structure to the ridge at the location of the light emitting point is varied from 0% to 27.5%. As FIG. 4A shows, in a double wavelength LD laser as in the embodiment of the present invention, when the ratio from the center to the location of the 650 nm-LD light emitting point exceeds 25%, especially the polarization ratio property in optical properties lowers. Therefore, to maintain the polarization ratio property, it is important to dispose the light emitting point at the location within 25%.

A linear relationship is seen in the polarization property between the ratio from the center of the chip and properties, and when ±5° is the criterion for checking the quality, as FIG. 4B shows, the center value of light emitting property can be kept within the criterion by disposing the light emitting points so that the distance between the center of the chip and the light emitting point is 0 to 15% of the width of the chip.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-112543, filed on Apr. 8, 2005 including specification, claims, drawings and summary, on which the Convention priority of the present application is based, are incorporated herein by reference in its entirety.

What is claimed is:

1. A semiconductor laser apparatus having two light emitting points, the semiconductor laser apparatus comprising:
    a substrate having a width and a center along a width direction; and
    two simple ridge stripe structures, each simple ridge stripe structure including a respective light emitting point directly opposite the corresponding simple ridge stripe structure, wherein
    both of the light emitting points of the corresponding simple ridge stripe structures are disposed at locations spaced from a line perpendicular to and passing through the center of the substrate,
    the light emitting points of the two simple ridge stripe structures are asymmetrically disposed with respect the line perpendicular to and passing the center of the substrate, and
    one of the light emitting points of the correpsonding simple ridge stripe structure is disposed at a distance along the width direction from the line perpendicular to and passing through the center of the substrate by a distance not larger than 15% of the width of the substrate.

2. The semiconductor laser apparatus according to claim 1, wherein the semiconductor laser apparatus emits light of at least two different wavelengths.

3. The semiconductor laser apparatus according to claim 1, wherein the semiconductor laser apparatus emits light at a wavelength, first of the light emitting points, of 785±20 nm.

4. The semiconductor laser apparatus according to claim 1, wherein the semiconductor laser apparatus emits light at a wavelength, at at least one of the light emitting points, of 655±20 nm.

5. The semiconductor laser apparatus according to claim 1, wherein the semiconductor laser apparatus emits light at a wavelength1 at the one light emitting point of the light emitting points which is closer to the center of the substrate, of 655±20 nm.

6. The semiconductor laser apparatus according to claim 1, wherein the width of the substrate is 100 μm to 300 μm.

7. The semiconductor laser apparatus according to claim 3, wherein a second of the light emitting points is located 110±10 μm from the first light emitting point, and the first light emitting point is closer to the line passing perpendicular to and through the center of the substrate in the width direction of the substrate.

8. The semiconductor laser apparatus according to claim 3, wherein the first light emitting point is located 110±10 μm from a second of the light emitting points, and the first light emitting point is closer to the line passing perpendicular to and through the center of the substrate in the width direction of the substrate.

9. The semiconductor laser apparatus according to claim 3, further including an electrically isolating structure between light emitting points.

10. The semiconductor laser apparatus according to claim 1, further comprising a first hetero structure including a first active layer between an upper cladding layer and a lower cladding layer, and a second hetero structure including a second active layer between the upper cladding layer and the lower cladding layer, wherein
    the first active layer has a different structure from the second active layer, and
    upper layer parts of the first and second active layers are fabricated from the same materials and have the same layer thicknesses, and include ridge stripe structures.

11. The semiconductor laser apparatus according to claim 10, wherein the ridge stripe structures are simultaneously fabricated using a mask pattern.

12. The semiconductor laser apparatus according to claim 10, wherein the first active layer has an AlGaAs multi-quantum well structure and the second active layer has an AlGaInP multi-quantum well structure, the upper cladding layer and the lower cladding layer are composed of AlGaInP, and layers above the first active layer and the second active layer are composed of the same materials and have the same composition.

13. The semiconductor laser apparatus according to claim 10, wherein at least a part of the materials of the first and second active layers include of $Al_xGa_yIn_{1-x-y}As_zP_{1-z}$ ($0 \leq x \leq 1$, $0 \leq y \leq 1$, $0 \leq z \leq 1$).

14. The semiconductor laser apparatus according to claim 10, wherein at least a part of the materials of the first and second active layers include $Al_xGa_yIn_{1-x-y}N_zAs_{1-z}$ ($0 \leq x \leq 1$, $0 \leq y \leq 1$, $0 \leq z \leq 1$).

* * * * *